United States Patent
Hamanaka et al.

(10) Patent No.: US 6,548,421 B1
(45) Date of Patent: *Apr. 15, 2003

(54) METHOD FOR FORMING A REFRACTORY-METAL-SILICIDE LAYER IN A SEMICONDUCTOR DEVICE

(75) Inventors: Nobuaki Hamanaka, Tokyo (JP); Ken Inoue, Tokyo (JP); Kaoru Mikagi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/560,337

(22) Filed: Apr. 28, 2000

(30) Foreign Application Priority Data

Apr. 28, 1999 (JP) .......................... 11-121410

(51) Int. Cl.⁷ ............................. H01L 21/302
(52) U.S. Cl. .................. 438/753; 438/682; 438/683; 438/756
(58) Field of Search ............. 438/682, 683, 438/753, 756, 766, 770

(56) References Cited

U.S. PATENT DOCUMENTS

| | | | | |
|---|---|---|---|---|
| 4,575,920 A | * | 3/1986 | Tsunashima | 438/297 |
| 5,342,794 A | * | 8/1994 | Wei | 438/374 |
| 5,847,428 A | * | 12/1998 | Fulford, Jr. et al. | 257/344 |
| 6,080,648 A | * | 6/2000 | Nagashima | 438/592 |
| 6,197,646 B1 | * | 3/2001 | Goto et al. | 438/301 |
| 6,268,285 B1 | * | 7/2001 | Avanzino et al. | 438/655 |

FOREIGN PATENT DOCUMENTS

| | | | |
|---|---|---|---|
| JP | A 8-48996 | | 2/1996 |
| JP | 08250451 A | * | 9/1996 |
| JP | 09116038 A | * | 5/1997 |
| JP | A 10-27908 | | 1/1998 |
| JP | A 10-150005 | | 6/1998 |
| JP | A 10-172921 | | 6/1998 |
| JP | A 10-270381 | | 10/1998 |
| JP | A 11-54455 | | 2/1999 |
| JP | 11-054468 | * | 2/1999 |

OTHER PUBLICATIONS

Wolf, S. and Tauber, R.N., "Silicon Processing for the VLSI Era", vol. 1, pp. 198, 209–210, 1986.*

* cited by examiner

Primary Examiner—Amir Zarabian
Assistant Examiner—Christy Novacek
(74) Attorney, Agent, or Firm—Young & Thompson

(57) ABSTRACT

A method for forming a silicide of a metal with high-melting-point in a semiconductor device includes the step of removing a higher-density impurity area which acts for prevention of refractory-metal-silicification of diffused regions between the steps of implanting impurities to form an impurity-implanted region and annealing for refractory-metal-silicification of the diffused layer. The refractory-metal-silicification of the diffused regions proceeds smoothly to thereby prevent degradation of the initial gate withstand voltage and a higher sheet resistance.

12 Claims, 7 Drawing Sheets

METHOD FOR FORMING A REFRACTORY-METAL-SILICIDE LAYER IN A SEMICONDUCTOR DEVICE

BACKGROUND OF THE INVENTION (a) Field of the Invention

The present invention relates to a method for forming a silicide of a metal with high-melting-point (also referred to as refractory-metal-silicide in this text) in a semiconductor device, and more in particular, to the method for forming silicide of a metal with a high-melting-point on the surfaces of source/drain regions of a silicon substrate.

(b) Description of the Related Art

Since a channel length is reduced with decrease of the line width of a gate electrode with the advance of the high integration of a semiconductor device, it is desired to suppress a short-channel effect in a MOSFET having shallower source/drain regions to thereby secure a desired source-drain withstand voltage.

In a MOSFET including source/drain regions having the shallower junction, the gate delay time is liable to be extended due to the increase of the sheet resistance, whereby the operational frequency of a transistor is reduced to increase the length of a response time.

In order to overcome the problem, the reduction of the resistance of the impurity-diffused region is important. A method of forming a refractory-metal silicide layer having a lower resistance on the impurity-diffused region is conventionally developed for reducing the resistance of the surface of the diffused region.

The method for forming a metal-silicide layer in the diffused regions includes the steps of depositing a thin metal layer on the entire surface of a silicon layer, and heat-treating the wafer (annealing for silicification) to proceed a silicification reaction at an interface between the metal layer and the silicon layer for forming a metal silicide in a self-aligned manner.

As a metal with high-melting-point by which a silicon surface is subjected to a refractory-metal-silicification process, titanium, cobalt etc. are noticed, and a new process is developed in which silicon surface is subjected to cobalt-silicification to form a $CoSi_x$ layer on the diffused regions.

In the process, a cobalt film formed on a silicon surface is annealed for cobalt-silicification of the diffused regions to form the $CoSi_x$ layer.

Referring to FIGS. 1A to 1C, a conventional process for cobalt-silicification of diffused region to form a $CoSi_x$ film on the gate electrode and the source/drain region of an NMOS transistor will be described.

As shown in FIG. 1A, a gate oxide film 46 and a polysilicon layer are formed on each isolated region of a silicon substrate 42 separated by an element-isolation region 44, and the polysilicon layer is patterned to form a gate electrode 48. Side walls (or side-wall spacers) 50 are formed along both sides of the gate electrode 48, and a masking oxide film 52 is formed on the entire surface of the wafer.

Then, impurity-implanted regions 54 to be formed as source/drain regions are under both sides of the gate electrode 48 by implanting arsenic ions thereto Subsequent activating RTA annealing of the impurity-implanted regions 54 diffuses the implanted arsenic ions to form a source/drain region 54.

Then, as shown in FIG. 1B, the masking oxide film 52 is removed. After the entire surface of the wafer is subjected to an $O_2$-plasma treatment and washed, the wafer surface is subjected to a hydrogen fluoride (HF) treatment as a pretreatment of cobalt sputtering.

After the cobalt metal is deposited on the entire wafer surface by sputtering, a first annealing for cobalt-silicification is conducted. Then, after a selective wet-etching is conducted on the cobalt-silicide layer to remove the unreacted cobalt metal, a second annealing for cobalt-silicification is conducted for completing the cobalt-silicification reaction to form a $CoSi_2$ film 56 on the gate electrode 48, and the source/drain region 54 in a self-aligned manner.

In the process described above, the following problems arise when the $CoSi_2$ film is formed by employing the above conventional method.

Firstly, the $CoSi_2$ film 56 may have an uneven surface or a concave-convex surface 58 having a steep slope and a sharp edge as shown in FIG. 2, which impairs reduction of resistance of the source/drain regions. If the uneven shape becomes more conspicuous, a white cloud which may be generated by peeling-off of a part of the $CoSi_2$ film is formed on the substrate, or the concave-convex is formed on the entire surface Thus, an impurity-diffused region having a desired low resistance is difficult to achieve.

Secondly, the initial withstand voltage of a gate electrode (or initial gate-oxide-film breakdown voltage) is low.

Similar problems arise when another metal having a high-melting-point, for example, $TiSi_x$ is formed although the $CoSi_2$ is herein exemplified as the silicide of a metal having the high-melting-point.

SUMMARY OF THE INVENTION

In view of the foregoing, an object of the present is to provide a method for forming silicide of a high-melting-point metal, or a refractory-metal silicide, in a semiconductor device without causing the above problems.

The present invention provides, in a first aspect thereof, a method for forming a silicide of a metal with high-melting-point in a semiconductor device including the steps of: implanting impurity ions into a silicon substrate to form an impurity-implanted region; heat-treating the silicon substrate to form an oxide layer on a top of the impurity-implanted region; etching the oxide layer for removal thereof by using a basic oxidant solution; heat-treating the impurity-implanted region to diffuse the impurity ions to form an impurity-diffused region from the impurity-implanted region; depositing a metal with high-melting-point to form a metal layer on the impurity-diffused region; and heat-treating the metal layer for refractory-metal-silicification of the impurity-diffused region.

The present invention provides, in a second aspect thereof, a method for forming a silicide of a metal with high-melting-point in a semiconductor device including the steps of: implanting impurity ions into a silicon substrate to form an impurity-implanted region; heat-treating the impurity-implanted region to diffuse the impurity ions to form an impurity-diffused region from the impurity-implanted region; etching a top of the impurity-diffused region for removal thereof by using a basic oxidant solution; depositing a metal with high-melting-point to form a metal layer on the impurity-diffused region; and heat-treating the metal layer for refractory-metal-silicification of the impurity diffused region.

In general, the top portion of the impurity-implanted region having a higher impurity concentration may act for prevention of refractory-metal-silicification of the impurity-diffused region after the annealing process for diffusing the implanted impurity ions, In accordance of the first and second aspects of the present invention, the top portion is removed after oxidization (first aspect) or directly after the implantation (second aspect), before forming a refractory-metal-silicide layer of the impurity-diffused region. Thus, the refractory-metal-silicification proceeds smoothly to thereby afford a higher initial gate withstand voltage and a lower sheet resistance for the gate electrode and the source/drain regions of a MOSFET.

The above and other objects, features and advantages of the present invention will be more apparent from the following description.

PREFERRED EMBODIMENTS OF THE INVENTION

Figure 1A:
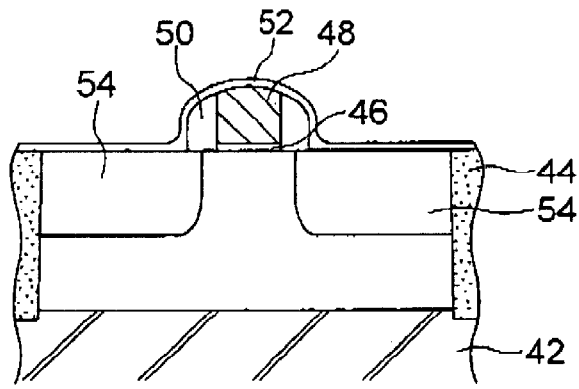
FIGS. 1A to 1C are vertical cross sectional views showing consecutive steps of conventionally fabricating a metal silicide layer in a semiconductor device.
Figure 1B:
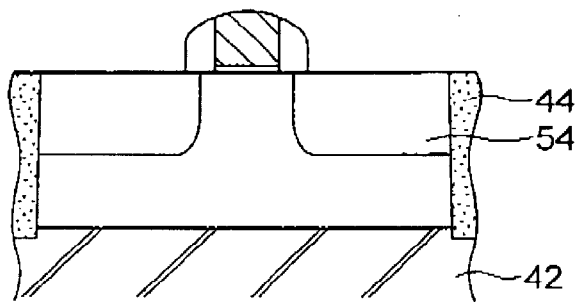
Figure 1C:
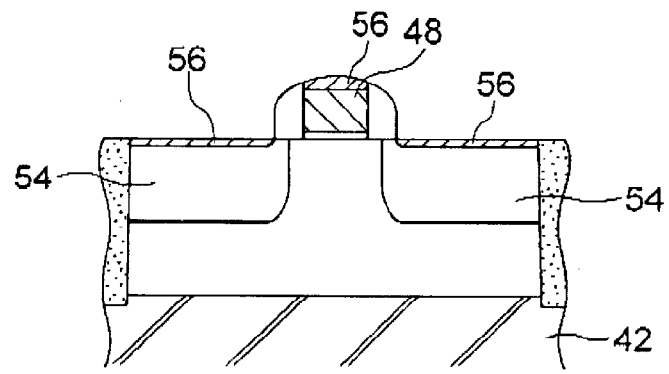
Figure 2:
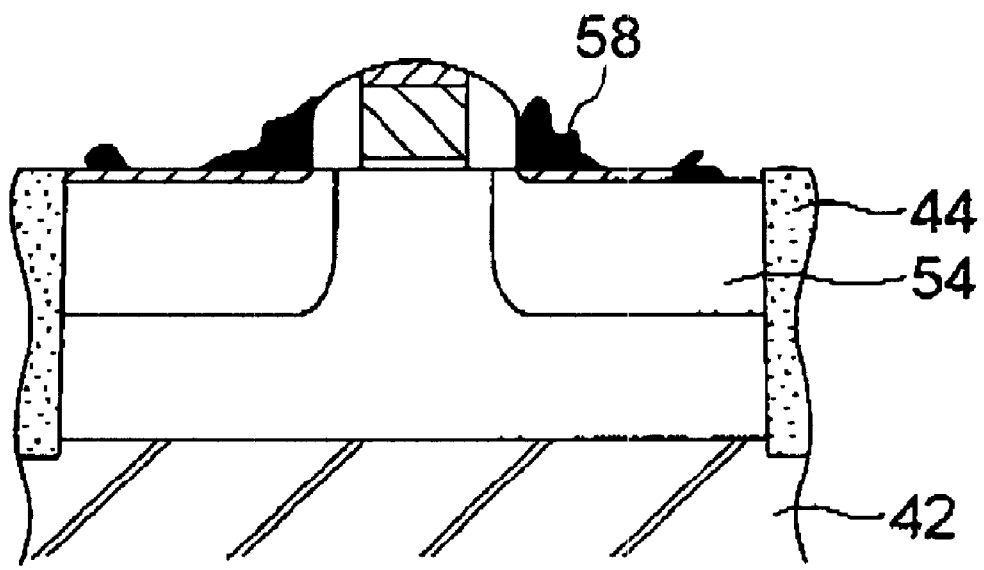
FIG. 2 is a vertical cross sectional view of a possible concave-convex surface on the metal silicide layer.

Before describing preferred embodiments of the present invention, principles of the present invention will be described for a purpose of clear understanding.

After investigating the first problem of the concave-convex $CoSi_2$ layer, the present inventors have found that an area including arsenic ions as impurities at a higher density (a high-density area) is formed during implanting arsenic ions onto the top surface of a silicon substrates The high-density area acts for prevention of refractory-metal-silicification of the diffused regions.

More specifically, at the time of implanting the arsenic ions, the higher-density area is usually formed in the uppermost part of the silicon substrate ranging from the top surface of the substrate to a depth of about 10 Å. The higher-density area is oxidized to form a layer acting for prevention of refractory-metal-silicification of the diffused regions (silicification-prevention layer) after the heat treatment for activating the arsenic ions. Even when the cobalt film on such a silicification-prevention layer is heat-treated, formation of the silicide between the cobalt film and silicon is insufficient to provide a silicide film having a deteriorated resistance, which is easily peeled off by selective wet-etching. As a result, a concave-convex surface having a steep slope and a sharp edge may be formed on the silicide film.

The present inventors have ascertained in connection with the second problem that a damage of the gate electrode surface due to an $O_2$-plasma treatment lowers the initial gate withstand voltage. However, only the HF treatment without the $O_2$-plasma treatment causes a problem that a formed $CoSi_2$ film has a high sheet resistance. Accordingly, the $O_2$-plasma treatment cannot be omitted.

The present inventors have conceived that immediately after the implantation of the arsenic ions, or immediately after removal of a cover film, the uppermost part of the substrate, for example, from the surface to a depth of 10 to 40 Å is oxidized, and the oxidized part is removed by a basic oxidant solution, and have reached to the present invention after repeated experiments.

In the first aspect of the present invention, a higher-density impurity area which is hardly subjected to refractory-metal-silicification and is formed in the uppermost part of the impurity-diffused region is oxidized at a lower temperature to be converted into an amorphous mixed oxide layer. The amorphous mixed oxide layer generally includes a larger number of terminations of silicon bonds due to increased substitute reactions by oxygen at the silicon bonds. The mixed oxide layer can be easily removed by dipping the substrate in the basic oxidant solution. Thus, the higher-density impurity area is removed not to cause the conventional problem in connection with the deficiency in the $CoSi_2$ film shape. The thickness of the oxide layer to be removed is generally thicker than that of the higher-density impurity area.

Preferably, a heat-oxide layer having a thickness between 1 and 4 nm is formed by a lower temperature oxidation treatment at a temperature of 800° C. or less in the step of converting the uppermost part of the impurity layer into the oxide film. Thereby, all the higher-density impurity area is removed.

In the first aspect of the invention, when the impurity ion for forming the impurity diffused region is implanted by using a protective film overlying the silicon substrate, the protective film is removed before the conversion of the uppermost part into the oxide film.

Since the precise control of the thickness of the impurity-implanted region to be converted into the oxide film by the heat-treatment is difficult in the first aspect of the present invention, an amount of scraping the substrate by using the basic oxidant solution may be excessive, or the concave-convex may be formed in the impurity-diffused region, or the impurity density in the impurity-diffused region may be varied.

In view of the possible problems arising in connection with the first aspect of the invention, the present inventors have reached, after repeated experiments, to a second aspect of the invention in which the higher-density impurity areas are directly removed by the basic oxidant solution.

Also in the second aspect, the protective film can be used.

In the first and second aspects of the invention, a mixed aqueous solution containing ammonia and hydrogen peroxide (hereinafter referred to as "ammonia peroxide water") is preferably employed as the basic oxidant solution after it is heated to a temperature of 60°C. or more.

In the first and second aspects of the invention, a layer having a damage due to the ion-implantation in addition to the oxide film or the higher-density impurity area may be removed by the etching which employs the basic oxidant solution.

The metal with high-melting-point (or refractory metal) to be used in the present invention is not restricted to any specific refractory metal so long as the refractory metal can form a refractory-metal-silicide of the diffused region. The method of the present invention can be most properly employed in a process in which arsenic ions are implanted into a silicon substrate as impurities for forming source/drain regions, and $CoSi_2$ films are formed on the surface of the source/drain regions.

In the present invention, when a silicon-based material is used as the gate electrode, another refractory-metal-silicide layer may be simultaneously formed in the uppermost part of the gate electrode together with the refractory-metal-silicide layer in the uppermost part of the impurity-diffused region.

Now, the present invention is more specifically described with reference to annexed drawings.

First Embodiment

Figure 3A:
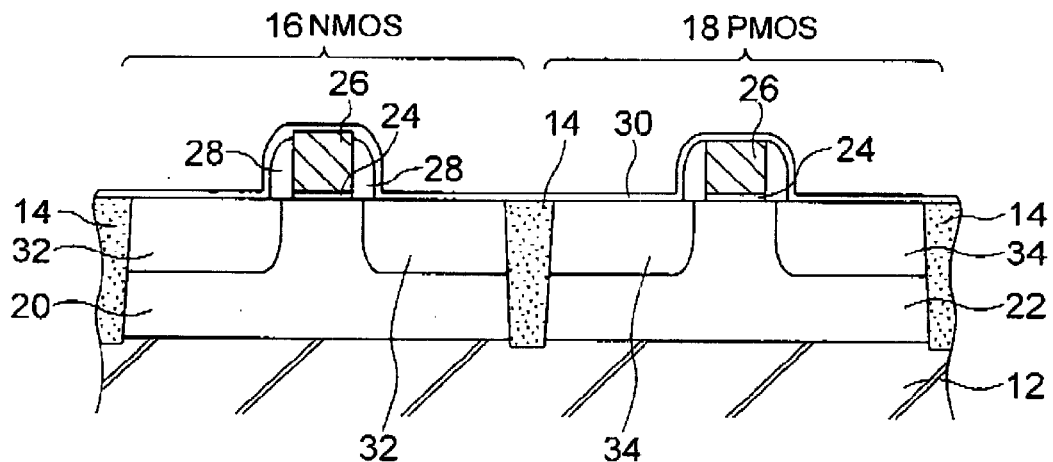
FIGS. 3A to 3E are vertical cross sectional views showing consecutive steps of fabricating a metal silicide layer in a semiconductor device in accordance with a first embodiment of the present invention.

Referring to FIGS. 3A to 3E, a method for fabricating a CMOS device in accordance with a first embodiment of the present invention will be described. An element-isolation region 14 was formed on a silicon substrate 12 to form an NMOS forming region 16 and a PMOS forming region 18 as shown in FIG. 3A. Then, p-type impurities were implanted into the NMOS forming region 16 to form a P-well 20, and n-type impurities were implanted into the PMOS forming region 18 to form an N-well 22. Then, a gate oxide film 24 and a polysilicon layer were formed on the NMOS forming region 16 and the PMOS forming region 18, and the polysilicon layer was patterned to provide a gate electrode 26 having side walls 28 on its both side surfaces. Then, a masking oxide film 30 was formed on the entire substrate surface by a known CVD method.

An arsenic ion was implanted as N-type impurities into the NMOS forming region 16 to form N-type impurity-implanted regions 32 at the both bottom sides under the gate electrode 26. A boron ion was implanted as P-type impurities into the PMOS forming region 18 to form P-type impurity-implanted regions 34 at the both bottom sides under the gate electrode 26, thereby providing a wafer shown in FIG. 3A.

Figure 3B:
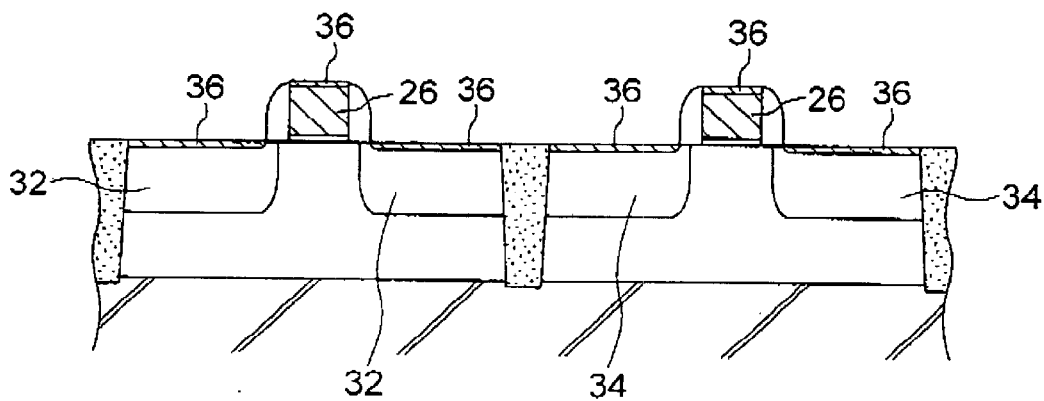

The masking oxide film 30 was removed by wet-etching using hydrogen fluoride. Thereby, higher-density areas 36 having a thickness of about 10 Å and later acting for prevention of silicification were formed on the gate electrode 26, the N-type impurity-implanted regions 32, and the P-type impurity-implanted regions 34 as shown in FIG. 3B.

Figure 3C:
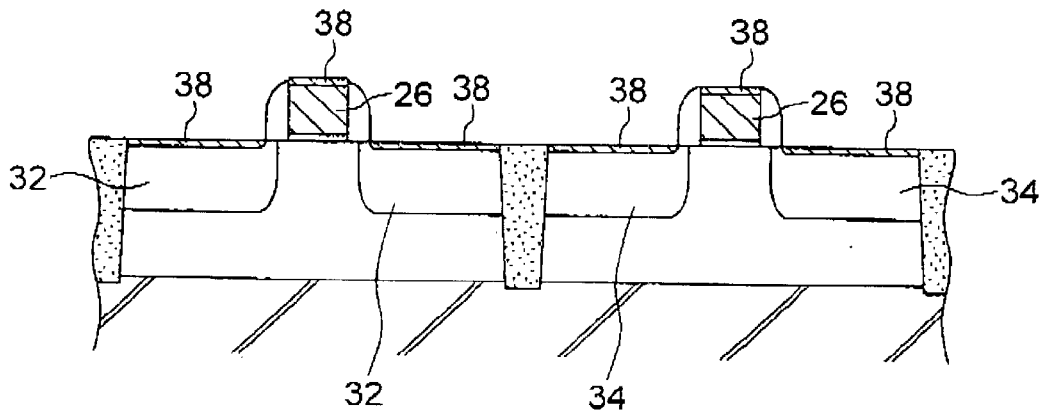

Through an ordinary washing procedure and a heat-oxidation treatment at a temperature of 800° C. conducted to the substrate, oxide films 38 having a thickness of about 30 Å were formed an the gate electrode 26, the N-type impurity-implanted regions 32, and the P-type impurity-implanted regions 34 as shown in FIG. 3C.

Thereby, the higher-density areas 36 were converted into the oxide films 38 which were present on the tops surfaces of the gate electrode 26, the N-type impurity-implanted regions 32, and the P-type impurity-implanted regions layers 34.

Then, the substrate was dipped in the ammonia peroxide water at a temperature of 65° C. in a volumetric ratio of $NH_4OH:H_2O_2:H_2O=1:1:5$ for 30 minutes to remove the oxide film 38. Thereby, the higher-density areas 36 were consequentially removed, and the surface of the gate electrode 26 or the oxide film 38 became smooth to prevent degradation of the initial gate withstand voltage.

Then, the substrate was heat-treated under the following conditions to activate the arsenic ions and the boron ions implanted into the N-type impurity-implanted regions 32 and the P-type impurity-implanted regions 34, respectively.

Heat-Treatment Conditions for Activation
  Ambient Atmosphere: Nitrogen
  Temperature: 950 to 1100° C.
  Treatment Time: About 10 seconds Then, after an ordinary washing procedure, the substrate was treated with the HF under the following conditions.

Figure 3D:
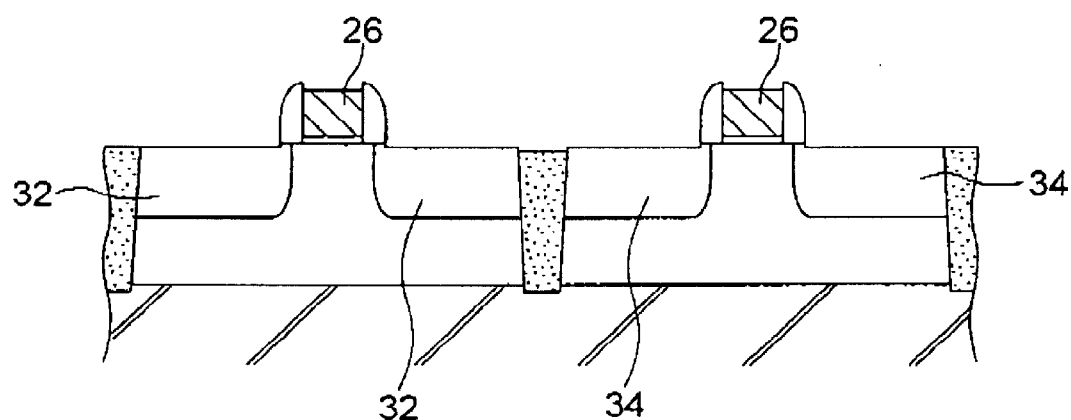
Figure 3E:
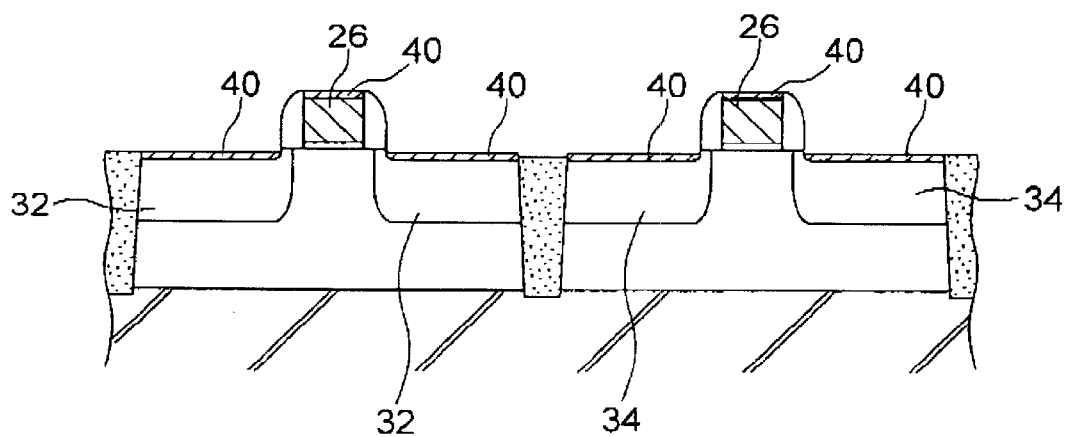

HF Treatment Conditions
  Volumetric Ratio of HF: $HF/H_2O=1/100$
  Temperature: 20 to 30° C.
  Treatment Time: about 1 minute The HF treatment prepares the substrate, including the gate electrode 26, the N-type source/drain region 32 as the P-type source/drain region 34, as a pretreatment for the cobalt sputtering as shown in FIG. 3D.

Then, a cobalt film having a thickness of 5 to 20 nm was deposited on the substrate by sputtering.

The substrate was then subjected to a first annealing for cobalt-silicification of diffused regions to form a $CoSi_2$ film under the following conditions.

Conditions for Annealing
  Ambient Atmosphere: Nitrogen
  Temperature: 500 to 750° C.
  Treatment Time: 20 to 60 seconds Then, wet-etching was conducted under the following conditions for removing the cobalt which had not been converted into the $CoSi_2$ and remained on the surface of the wafer, for example, the surfaces of the isolated regions 14 of the substrate and the side walls of the gate electrode 16.

Conditions for Etching
  Volumetric Ratio of Etchant: $HCl/H_2O_2/H_2O=(1$ to $3)/1/5$
  Temperature: about 40° C.
  Treatment Method: Dipping Method
  Treatment Time: 10 to 40 minutes Then, the cobalt layer was subjected to a second annealing for cobalt-silicification of the diffused regions under the following conditions for completing the conversion reaction from the cobalt into the $CoSi_2$ film 40 having substantially no defects and no deficiencies in shape which was formed on the gate electrode 26, the N-type source/drain region 32 and the P-type source/drain region 34.

Conditions for Annealing
  Ambient Atmosphere: Nitrogen
  Temperature: 750 to 900° C.
  Treatment Time: 30 seconds Although the masking oxide film 30 was formed on the entire substrate for preventing a damage of the substrate surface due to the ion-implantation in the present embodiment, such a masking oxide film may not be used when the source/drain region having a shallower junction depth is formed.

When no masking oxide film is formed, the ordinary washing procedure and the heat-oxidation treatment are conducted after the ion-implantation to form the oxide film 38.

Second Embodiment

Referring to FIGS. 4A to 4D, a method for fabricating a CMOS device in accordance with a second embodiment of the present invention will be described. Description of an element shown in FIGS. 4A to 4D similar to the element shown in FIGS. 3A to 3E will be omitted by affixing the same numeral thereto.

Figure 4A:
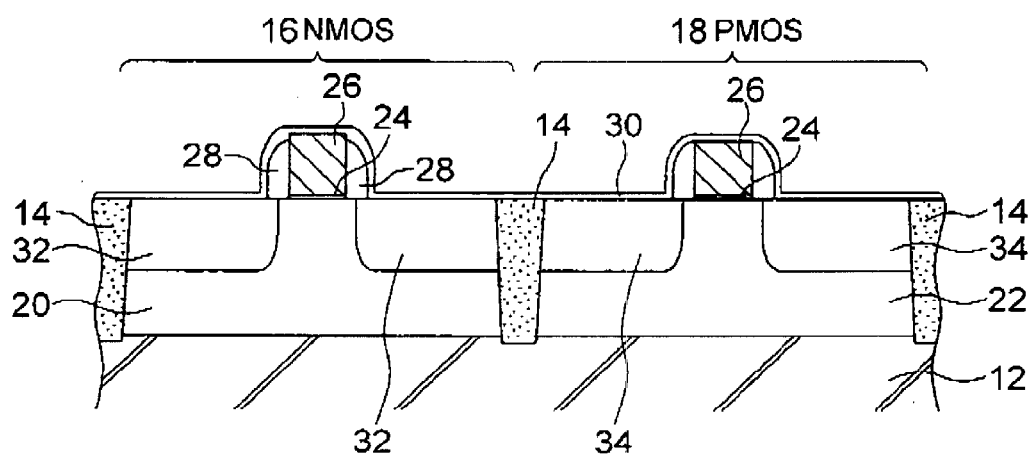
FIGS. 4A to 4D are vertical cross sectional views showing consecutive steps of fabricating a metal silicide layer in a semiconductor device in accordance with a second embodiment of the present invention.
Figure 4B:
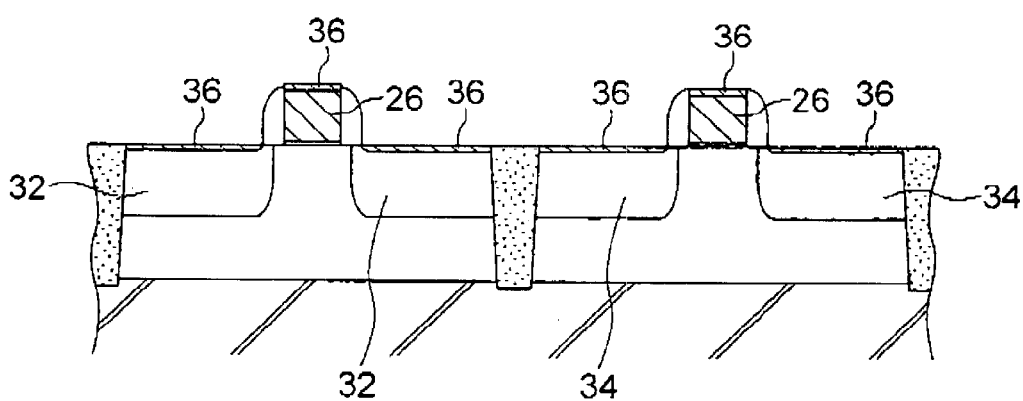
Figure 4C:
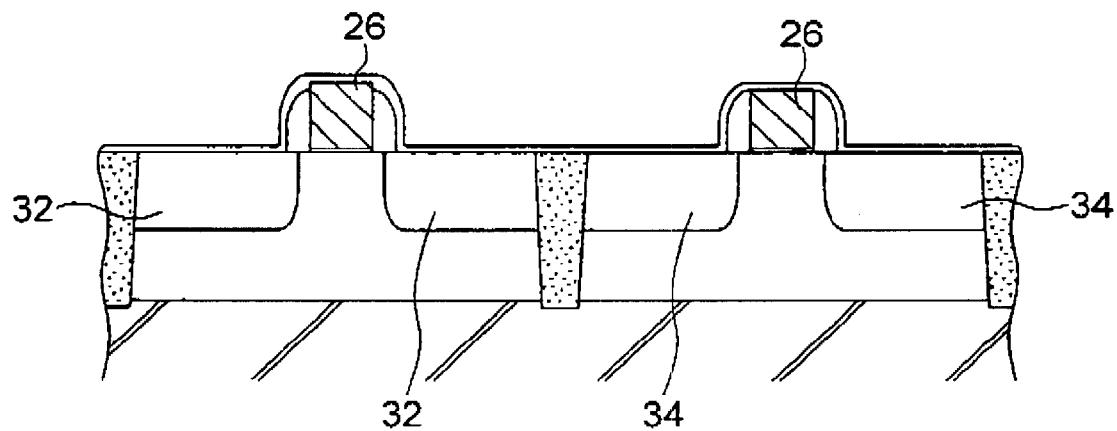
Figure 4D:
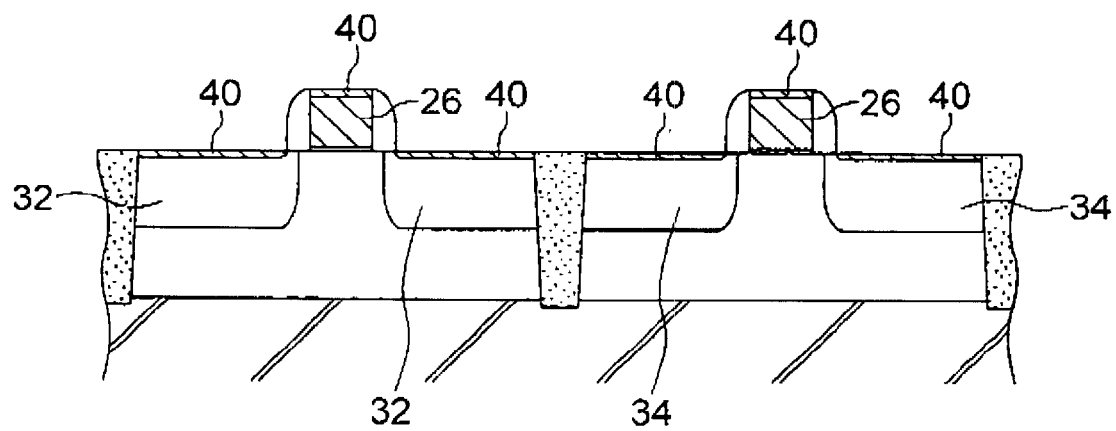

At first, similarly to the first embodiment, a substrate having a masking oxide film 30 shown in FIG. 4A was obtained, and the masking oxide film 30 was removed. Thereby, higher-density areas 36 having a thickness of about 10 Å and acting as a silicification-inhibiting layer were formed on a gate electrode 26, an N-type impurity-implanted regions 32, and a P-type impurity-implanted regions 34 as shown in FIG. 4B.

Then, in the present embodiment, a heat-treatment was conducted to the substrate under the following conditions for activating arsenic ions and boron ions implanted into the N-type impurity-implanted regions 32 and the P-type impurity-implanted regions 34, respectively.

Heat-Treatment Conditions for Activation

Ambient Atmosphere: Nitrogen

Temperature: 950 to 1100° C.

Treatment Time: About 10 seconds

Then, the substrate was dipped in ammonia peroxide water at a temperature of 65° C. in a volumetric ratio of $NH_4OH:H_2O_2:H_2O=1:1:5$ for 15 to 60 minutes. Thereby, the uppermost parts of the gate electrode 26, the N-type impurity-implanted regions 32 and the P-type impurity-implanted regions 34 were removed by thicknesses of about 10 Å resulting in the removal of the higher-density areas 36, and the gate electrode 26 having a smooth surface was obtained.

After an ordinary washing procedure, the substrate was treated with the HF under the following conditions.

HF Treatment Conditions

Volumetric Ratio of HF: $HF/H_2O=1/100$

Temperature: 20 to 30° C.

Treatment Time: About 1 minute

The HF treatment prepares the substrate, including the gate electrode 26, the N-type source/drain region 32 and the P-type source/drain region 34, as a pretreatment prior to cobalt sputtering.

Then, a cobalt film having a thickness of about 5 to 20 nm was deposited on the substrate by sputtering.

The substrate was then subjected to a first annealing for cobalt-silicification of diffused regions to convert the cobalt film into a $CoSi_2$ film under the following conditions.

Conditions for Annealing

Ambient Atmosphere: Nitrogen

Temperature: 500 to 750° C.

Treatment Time: 20 to 60 seconds

Then, wet-etching was conducted under the following conditions for removing the cobalt which had not been converted into the $CoSi_2$ and remained on the surface of the wafer, for example, on the surfaces of the isolated region 14 and the side walls of the gate electrode 16.

Conditions for Etching

Volumetric Ratio of Etchant: $HCl/H_2O_2/H_2O=(1 \text{ to } 3)/1/5$

Temperature: About 40° C.

Treatment Method: Dipping Method

Treatment Time: 10 to 40 minutes

Then, the cobalt layer was subjected to a second annealing for cobalt-silicification of diffused regions in the following conditions for completing the conversion reaction from the cobalt into the $CoSi_2$ film 40 having substantially no defects and no deficiencies in shape which was formed on the gate electrode 26, the N-type source/drain region 32 and the P-type source/drain region 34.

Conditions for Annealing

Ambient Atmosphere: Nitrogen

Temperature: 750 to 900° C.

Treatment Time: 30 seconds

Although the masking oxide film 30 was formed on the entire substrate for preventing a damage of the substrate surface due to the ion-implantation in the first embodiment, such a masking oxide film may not be used when the source/drain region having a shallower junction depth is formed.

When no masking oxide film is formed, the activation treatment is conducted immediately after the ion-implantation, and then the etching using the ammonia peroxide water is conducted.

Test for Measuring Initial Gate Withstand Voltage

In order to evaluate the second aspect of the present invention, the respective chips of the wafers having the $CoSi_2$ film fabricated in accordance with the method of the second embodiment were subjected to a test for measuring an initial gate withstand voltage.

In order to compare the method of the second embodiment with the conventional method, a similar test was conducted to a substrate fabricated by the conventional method.

In the test, an electric filed strength was defined to be a voltage at which a current of 1 $\mu$A or more flowed when the voltage in a direction of charging was applied to the gate electrode. when the electric field strength was at 3 MV/cm or more, the initial gate withstand voltage was regarded as reaching to a standard, and when below 3 MV/cm, it was regarded as not reaching to the standard.

Figure 5A:
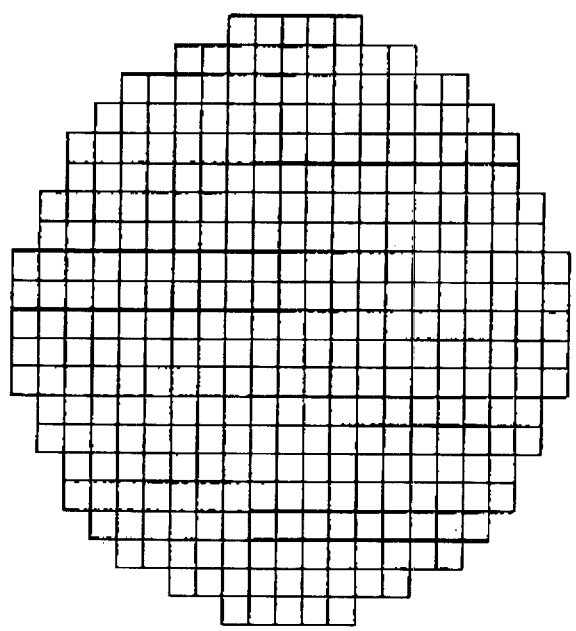
FIGS. 5A and 5B are plan top plan views of wafers showing results of a test for measuring an initial gate withstand voltage conducted in the second embodiment.
Figure 5B:
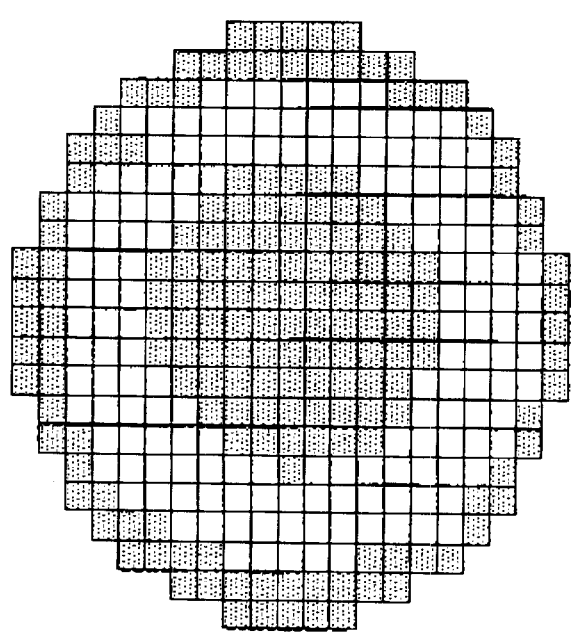

The results of the test conducted to the wafer of the to second embodiment is shown in a wafer of FIG. 5A, and that of the conventional method is shown in a wafer of FIG. 5B In FIGS. 5A and 5B, a white block indicates a chip having the initial gate withstand voltage not less than the standard, and a shaded block indicates a chip having the initial gate withstand voltage less than the standard.

No chips having the initial gate withstand voltage below the standard are observed in the wafer of the second embodiment as shown in FIG. 5A while the chips having the initial gate withstand voltage below the standard are observed in the central and peripheral parts of the conventional wafer as shown in FIG. 5B.

Judging from these test results, it may be estimated that the wafer including the $CoSi_2$ film uniformly having the high initial gate withstand voltage on the entire surface of the substrate is obtained in accordance with the method of the second embodiment to elevate a product yield of the semiconductor device. A similar result was also obtained in the wafer of the first embodiment.

Further in the method of the second embodiment for forming the $CoSi_2$ film, a white cloud which was likely to appear in the conventional method did not appear on the substrate surface after the cobalt-silicification reaction, and a concave-convex surface was not formed on the entire surface of the substrate.

Although $CoSi_2$ is exemplified as the refractory-metal-silicide in the first and second embodiments, another refractory metal may be used for forming a refractory-metal-silicide such as $TiSi_x$.

Since the above embodiments are described only for examples, the present invention is not limited to the above embodiments and various modifications or alternations can be easily made therefrom by those skilled in the art without departing from the scope of the present invention.

What is claimed is:

1. A method for forming a silicide of a metal with high-melting-point in a semiconductor device comprising the steps of:

forming a gate electrode having sidewalls on both side surfaces of the gate electrode;

then implanting impurity ions into a silicon substrate to form an impurity-implanted region;

then heat-treating the silicon substrate to form an oxide layer on top of the impurity-implanted region;

next etching the oxide layer for removal thereof by using a weak basic oxidant solution;

after said etching step, heat-treating the impurity-implanted region to diffuse the impurity ions to form a heavily-doped source/drain region from the impurity-implanted region;

subsequently depositing a metal with high-melting-point to form a metal layer on the heavily-doped source/drain region; and then heat-treating the metal layer for refractory-metal-silicification of the heavily-doped source/drain region.

2. The method as defined in claim 1, wherein said silicon substrate heat-treating step is conducted at a substrate temperature of 800° C. or less to form the oxide layer having a thickness between 1 nm and 4 nm.

3. The method as defined in claim 1, further comprising the steps of forming a protective layer on the silicon substrate prior to said implanting step and removing the protective layer from the silicon substrate after said implanting step.

4. The method as defined in claim 1, wherein the basic oxidant solution includes an aqueous solution of ammonia and hydrogen peroxide heated up to 60° C. or more.

5. The method as defined in claim 1, wherein said etching step removes a layer damaged by said implanting step.

6. The method as defined in claim 1, wherein said impurity ions are arsenic ions and said metal with high-melting-point is cobalt.

7. A method for forming a silicide of a metal with high-melting-point in a semiconductor device comprising the steps of:

forming a gate electrode having sidewalls on both side surfaces of the gate electrode;

then implanting impurity ions into a silicon substrate to form an impurity-implanted region;

then heat-treating the impurity-implanted region to diffuse the impurity ions to form a heavily-doped source/drain region from the impurity-implanted region;

subsequently etching a top of the heavily-doped source/drain region for removal thereof by using a weak basic oxidant solution;

after said etching step, depositing a metal with high-melting-point to form a metal layer on the heavily-doped source/drain region; and then heat-treating the metal layer for refractory, metal-silicification of the heavily-doped source/drain region.

8. The method as defined in claim 7, wherein said etching step removes the top of the impurity-implanted region in a thickness between 10 angstroms and 20 angstroms.

9. The method as defined in claim 7, further comprising the steps of forming a protective layer on the silicon substrate prior to said implanting step and removing the protective layer from the silicon substrate after said implanting step.

10. The method as defined in claim 7, wherein the basic oxidant solution includes an aqueous solution of ammonia and hydrogen peroxide heated up to 60° C. or more.

11. The method as defined in claim 7, wherein said etching step removes a damaged layer damaged by said implanting step.

12. The method as defined in claim 7, wherein said impurity ions are arsenic ions and said metal with high-melting-point is cobalt.

* * * * *